(12) United States Patent
Armstrong

(10) Patent No.: US 9,559,535 B2
(45) Date of Patent: Jan. 31, 2017

(54) PORTABLE ELECTRONIC STORAGE AND CHARGING APPARATUS

(71) Applicant: Deborah A. Armstrong, Lynchburg, VA (US)

(72) Inventor: Deborah A. Armstrong, Lynchburg, VA (US)

( * ) Notice: Subject to any disclaimer, the term of this patent is extended or adjusted under 35 U.S.C. 154(b) by 162 days.

(21) Appl. No.: 14/493,551

(22) Filed: Sep. 23, 2014

(65) Prior Publication Data
US 2016/0087469 A1   Mar. 24, 2016

(51) Int. Cl.
*H05K 7/00* (2006.01)
*H02J 7/00* (2006.01)
*H05K 7/20* (2006.01)

(52) U.S. Cl.
CPC ............... *H02J 7/0044* (2013.01); *H05K 7/20* (2013.01)

(58) Field of Classification Search
None
See application file for complete search history.

(56) References Cited

U.S. PATENT DOCUMENTS

| | | | |
|---|---|---|---|
| 5,610,979 A | 3/1997 | Yu | |
| 7,553,174 B2 * | 6/2009 | Roepke | H01R 13/72 439/136 |
| 8,390,255 B1 * | 3/2013 | Fathollahi | H02J 7/0045 206/308.3 |
| 8,415,924 B2 * | 4/2013 | Matthias | B25H 3/006 320/114 |
| 8,531,833 B2 | 9/2013 | Diebel et al. | |
| 8,579,172 B2 | 11/2013 | Monaco et al. | |
| 8,593,108 B2 * | 11/2013 | Ferber | H02J 7/0044 320/114 |
| 2005/0242223 A1 | 11/2005 | Woodward | |
| 2010/0171465 A1 * | 7/2010 | Seal | G03G 15/5004 320/114 |
| 2010/0231161 A1 * | 9/2010 | Brown | B25H 3/02 320/101 |
| 2011/0006729 A1 * | 1/2011 | Matthias | B25H 3/006 320/107 |
| 2011/0170249 A1 * | 7/2011 | Nunes | G01D 9/005 361/679.01 |
| 2012/0025766 A1 * | 2/2012 | Reade | H02J 7/0042 320/110 |

(Continued)

*Primary Examiner* — Courtney Smith
*Assistant Examiner* — Rashen E Morrison
(74) *Attorney, Agent, or Firm* — Dale J. Ream

(57) ABSTRACT

A portable electronics storage and charging apparatus for use in storing and charging handheld electronic devices that each includes a battery and a USB charging cable includes a case having a lower portion and an upper portion that each define respective cavities. The upper portion is pivotally coupled to the lower portion and movable between closed and open configurations. A master battery is situated in one of the lower or upper portion cavities. A plurality of spaced apart cable racks is coupled to the top wall of the upper portion of the case, each cable rack being configured to hold a respective charging cable associated with a respective electronic device. The master battery is electrically coupled to a respective charging cable held by a respective cable rack and configured to impart current to a respective electronic device when the respective device is electrically connected to the respective charging cable.

11 Claims, 6 Drawing Sheets

(56) References Cited

U.S. PATENT DOCUMENTS

| | | | |
|---|---|---|---|
| 2012/0229071 A1* | 9/2012 | Schuessler | H01M 10/46 320/101 |
| 2012/0286718 A1* | 11/2012 | Richards | A45F 3/04 320/103 |
| 2013/0038280 A1* | 2/2013 | Boundy | B60R 7/04 320/108 |
| 2013/0083456 A1 | 4/2013 | Koenig et al. | |
| 2013/0148839 A1 | 6/2013 | Stevinson | |
| 2013/0208937 A1 | 8/2013 | Stern et al. | |
| 2013/0214931 A1* | 8/2013 | Chia | H02J 7/0042 340/815.4 |
| 2013/0237290 A1 | 9/2013 | Simmons, Jr. et al. | |
| 2013/0265702 A1 | 10/2013 | Merenda | |
| 2013/0271081 A1* | 10/2013 | Wang | H02J 7/0044 320/111 |
| 2013/0314030 A1 | 11/2013 | Fathollahi | |
| 2014/0002004 A1* | 1/2014 | Farris-Gilbert | H02J 7/0027 320/103 |
| 2015/0171632 A1* | 6/2015 | Fry | H02J 7/0004 307/22 |
| 2015/0200554 A1* | 7/2015 | Marks | H02J 7/025 320/108 |
| 2015/0326044 A1* | 11/2015 | Ashley | H02J 7/0042 320/103 |
| 2016/0043357 A1* | 2/2016 | Aida | H02J 7/0054 429/7 |

\* cited by examiner

PORTABLE ELECTRONIC STORAGE AND CHARGING APPARATUS

BACKGROUND OF THE INVENTION

This invention relates generally to cases for transporting electronic devices and, more particularly, to a portable electronics case configured to recharge electronic devices while stored and transported therein.

Busy professionals often find themselves traveling through airports, office buildings, or in rental cars while carrying a laptop, tablet computing device, or cell phone. The multi-tasking professional may also have an electronic music device, electronic book reading device, or other electronic device. If the professional is to be gone overnight or even for multiple hours, a myriad of battery charging cables are needed to re-charge the respective batteries of the devices. Clearly, the difficulty and inconvenience of carrying multiple portable electronic device is by itself a daunting task. Then, the prospect of keeping all of these electronic devices in a fully charged condition is even more problematic.

Various devices are known in the prior art for storing and transporting electronic devices. Obviously, cases for transporting laptop computers and carrying cases for cell phones are well known. Although assumably effective for their intended purposes, the present devices are incapable of storing or carrying multiple electronic devices along with their respective charging cables and which include means for charging respective internal batteries during transport.

Therefore, it would be desirable to have a portable electronics case configured to recharge electronic devices that are stored and transported therein. Further, it would be desirable to have a portable electronics case that is configured to store multiple electronic devices, associated charging cables, and a master battery.

SUMMARY OF THE INVENTION

A portable electronics storage and charging apparatus according to the present invention for use in storing and charging handheld electronic devices that each includes a battery and a USB charging cable includes a case having a lower portion and an upper portion that together define respective lower and upper cavities. The upper portion is pivotally coupled to the lower portion and movable between closed and open configurations. A master battery is situated in one of the lower portion cavity and the upper portion cavity. A plurality of spaced apart cable racks is coupled to the top wall of the upper portion of the case, each cable rack being configured to hold a respective charging cable associated with a respective electronic device. The master battery is selectively electrically coupled to a respective charging cable held by a respective cable rack and configured to impart current to the first electronic device when the first electronic device is electrically connected to the respective charging cable.

Therefore, a general object of this invention is to provide a portable electronics storage and charging apparatus having a case that is configured to carry and store multiple handheld electronic devices and to charge them during storage or transport of the case.

Another object of this invention is to provide a portable electronics storage and charging apparatus, as aforesaid, that includes a plurality of cord racks having structures about which electronic device charging cords may be wound so as to stay organized and not become tangled.

Still another object of this invention is to provide a portable electronics storage and charging apparatus, as aforesaid, in which a stored charging cord can be electrically connected to a master battery and to an associated electronic device for recharging.

Yet another object of this invention is to provide a portable electronics storage and charging apparatus, as aforesaid, having a master battery that itself can be recharged.

Other objects and advantages of the present invention will become apparent from the following description taken in connection with the accompanying drawings, wherein is set forth by way of illustration and example, embodiments of this invention.

BRIEF DESCRIPTION OF THE DRAWINGS

FIG. 3b is an isolated view on an enlarged scale taken from FIG. 3a;

FIG. 4b is an isolated view on an enlarged scale taken from FIG. 4a;

DESCRIPTION OF THE PREFERRED EMBODIMENT

Figure 1A:
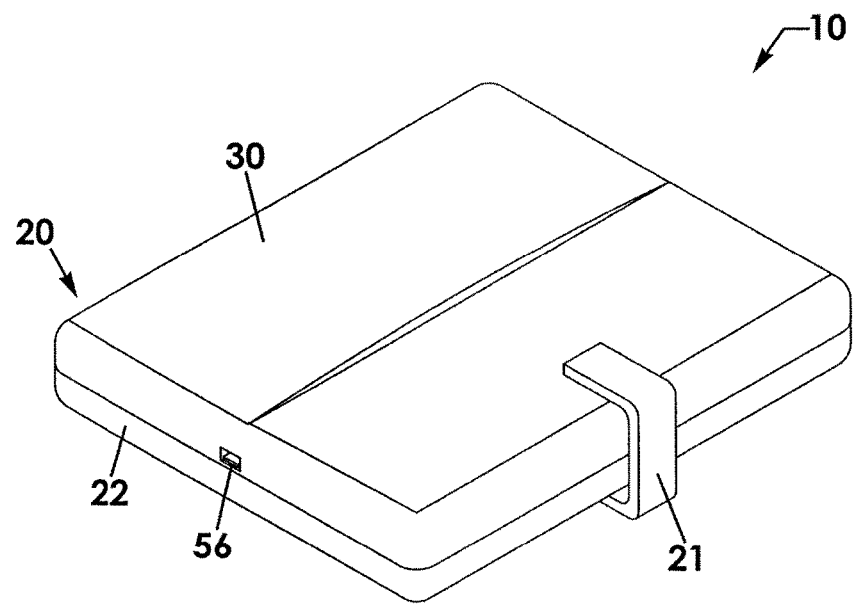
FIG. 1a is a perspective view of a portable electronics storage and charging apparatus according to a preferred embodiment of the present invention, illustrated in a closed and latched configuration.
Figure 1B:
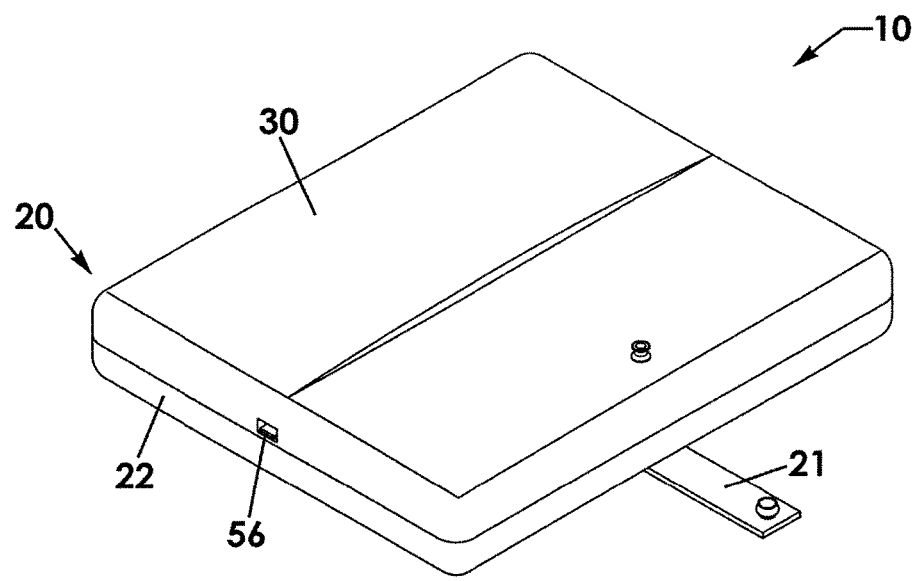
FIG. 1b is another perspective view of the apparatus as in FIG. 1a illustrated in a closed and unlatched configuration.

A portable electronics storage and charging apparatus according to a preferred embodiment of the present invention will now be described with reference to FIGS. 1 to 4 of the accompany drawings. The portable electronics storage and charging apparatus 10 includes a case 20 having an upper portion 30 pivotally coupled to a lower portion 22, a plurality of cable racks 40, and a master battery 50 situated to deliver stored electrical current to one or more handheld electronic devices while such devices are being stored or transported in the case 20. The present invention is for storing and charging electronic devices of the type having an internal battery and a charging cable 16 for re-charging its battery. For example, the present apparatus 10 may be used with a tablet, smart phone, portable game device, portable music player, or the like.

The portable electronics storage and charging apparatus 10 includes a case 20 having a lower portion 22 and an upper portion 30 pivotally coupled to the lower portion and movable between closed and open configurations. More particularly, the lower portion 22 of the case 20 includes a bottom wall 24 having a generally planar configuration and side walls 26 extending upwardly from perimeter edges of the bottom wall 24. Together, the bottom wall 24 and side walls 24 define a lower cavity 28 that is configured to receive and securely hold an electronic device such as a tablet or small laptop computer (FIG. 2).

Similarly, the upper portion 30 of the case 20 includes a top wall 32 having a generally planar configuration and side walls 34 extending upwardly/outwardly from perimeter edges of the top wall 32. Together, the top wall 32 and side walls 34 define an upper cavity 36 that is configured to hold an electronic device such as a cell phone or the like.

Figure 2:
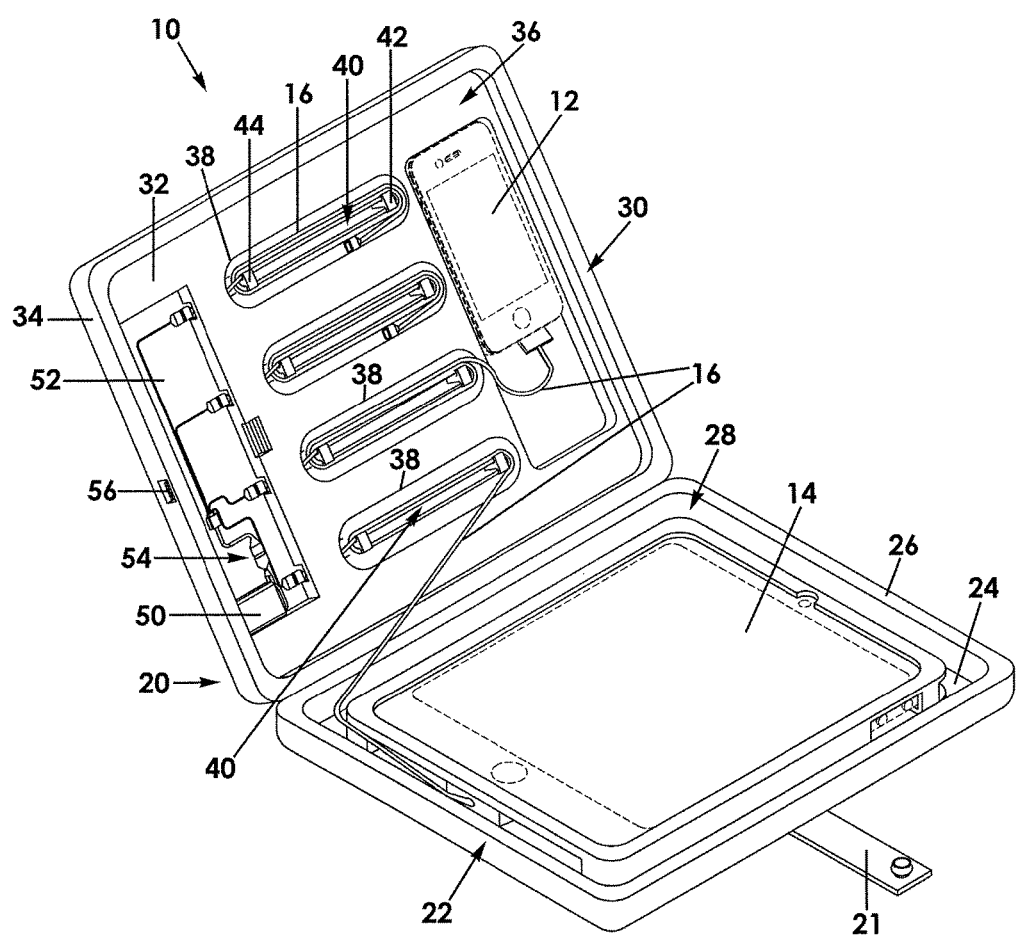
FIG. 2 is a perspective view of the apparatus illustrated in a open configuration.

The case 20 is movable between a closed configuration in which the side walls 26 of the lower portion 22 are in contact with or in close proximity with the corresponding side walls 34 of the upper portion 30 (FIG. 1a) and an open configuration in which the respective upstanding walls are displaced from one another (FIG. 2). The case 20 may be held in the closed configuration with a latch 21 or similar fastener. The respective upper and lower cavities are accessible to a user when the case 20 is at the open configuration but are not accessible at the closed configuration. Further, the bottom wall 24 of the lower portion 22 is in close proximity with the top wall 32 of the upper portion 30 at the closed configuration but is displaced from one another at the open configuration.

The electronics device held in the lower cavity 28 may be referred to herein as the first electronic device 14. As shown in the drawings, the second electronics device 14 is illustrated as being a tablet computer although this is by way of example and may be another type of electronic device. It is understood that the lower portion 22 of the case 20 may include an interior foam framework or some other structures to securely hold and protect the electronics device stored therein.

The upper cavity 36 of the upper portion 30 of the case 20 is configured to receive an electronics device—referred to herein as a first electronics device. In the drawings, the first electronic device 12 is shown to be a smart phone cellular communications device although this is merely by way of example. The upper cavity 36 may include an interior foam framework or a double wall configuration defining cutouts, recesses, or cavities configured to securely and safely hold and protect the first electronic device 12.

The portable electronics storage and charging apparatus 10 includes a master battery 50 situated in one of the cavities (i.e. in either the lower portion 22 or upper portion 30 of the case). As shown in the drawings, the upper portion 30 of the case 20 includes a battery compartment 52. The battery compartment 52 may be defined by the top wall 32 of the upper portion 30 of the case 20 or, alternatively, may have an independent wall structure inserted into the upper portion 30. The battery compartment 52 defines an interior space and the master battery 50 is positioned therein. Preferably, the master battery is a 9-volt battery and configured to supply current to the electronic devices so as to recharge their batteries as will be described below. For instance, the internal batteries of the portable electronic devices may be recharged when electrically connected to the master battery 50, such as when being stored or transported in the case 20.

The portable electronics storage and charging apparatus 10 includes a plurality of spaced apart cable racks 40 coupled to an inner surface of the top wall 32 of the upper portion 30 of the case 20 (FIG. 2). In an embodiment, the top wall 32 defines a plurality of recessed cavities 38, each being configured to receive a respective cable rack 40. Each cable rack 40 includes a first post 42 coupled to the top wall 32 of the upper portion 30 of the case and a second post 44 laterally spaced apart from the first post 42 and also coupled to the top wall 32. The posts are configured such that an electronics device charging cable 16 may be repeatedly wrapped between the first post 42 and second post 44 and, as a result, be retained by the cable rack 40. It is understood that each electronics device stored and transported in the case 20 is associated with a charging cable 16; accordingly, the associated charging cable 16 may be wound onto a respective cable rack 40.

The cable racks 40 are situated adjacent the battery compartment 52 but are situated such that an end of each charging cable 16 held by a respective cable rack 40 is selectively electrically coupled to the master battery 50. Specifically, the top wall 32 defines a plurality of channels 39 beneath the top wall 32 that interconnect respective recessed cavities 38 with the interior space of the battery compartment 52. In use, a portion of a charging cable 16 may be extended through a respective channel 39 into the battery compartment 52 and connected to the master battery 50. The other end of the same charging cable 16 may be plugged into its associated electronic device, whether the electronic device is situated in the upper portion 30 (FIG. 2) or in the lower portion 22 (FIG. 2) of the case 20. In this manner, current is transferred from the master battery 50 to the internal battery of an electronic device while the electronic device is being stored or transported in the case 20.

Figure 3A:
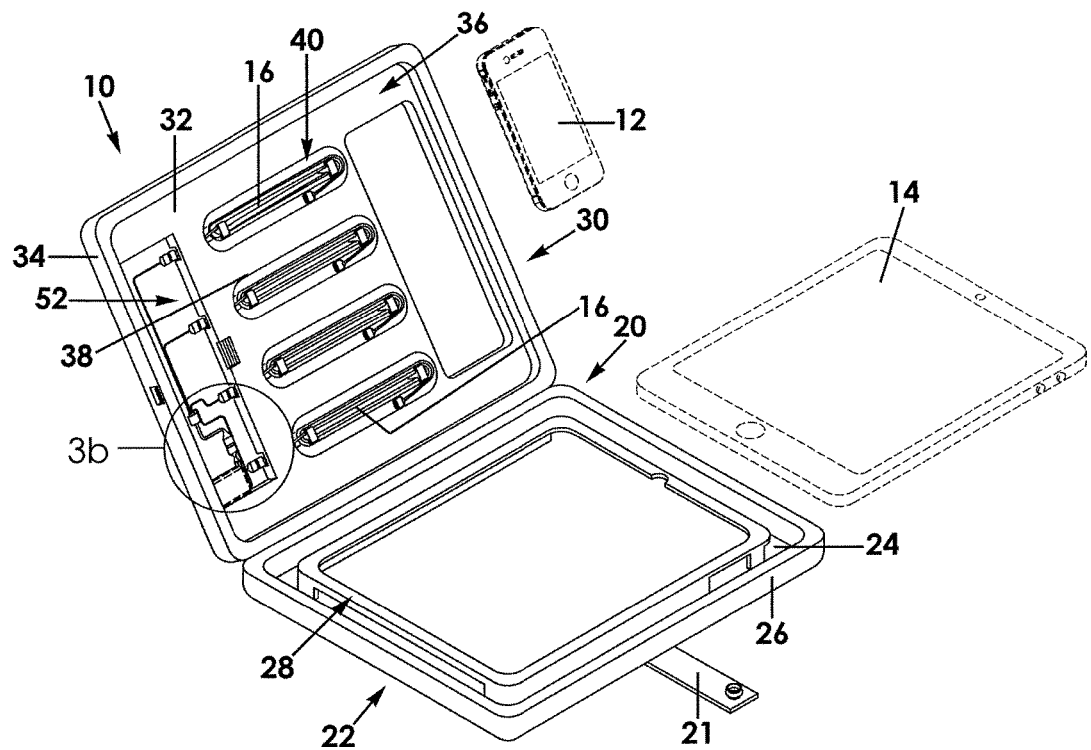
FIG. 3a is another perspective view of the apparatus as in FIG. 2 illustrated with the electronic devices removed.
Figure 3B:
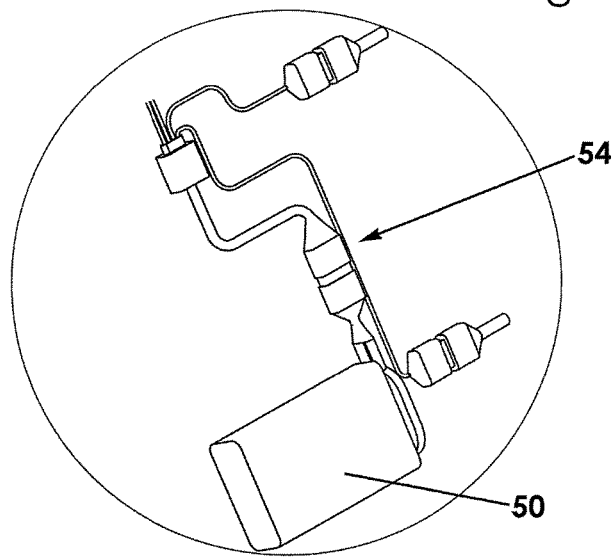
Figure 4A:
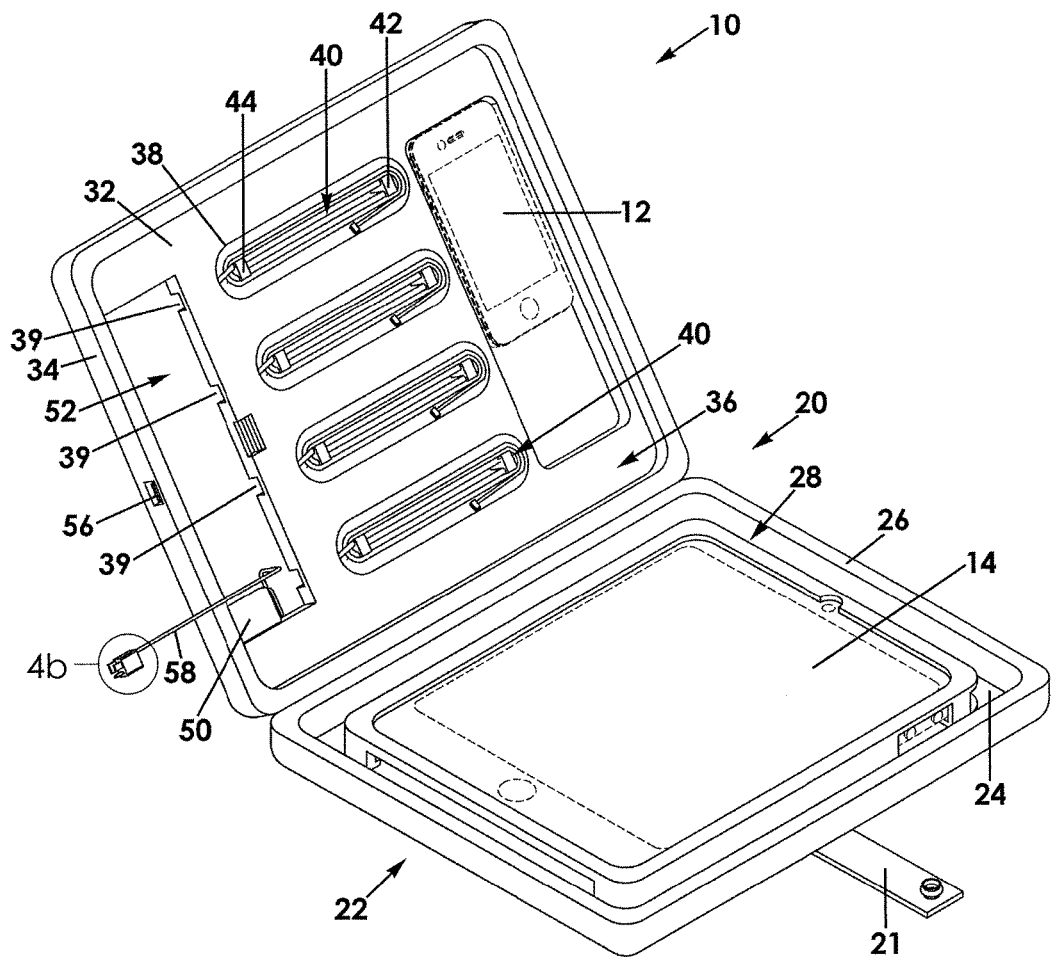
FIG. 4a is another perspective view of the apparatus as in FIG. 2 illustrating a power cord.
Figure 4B:
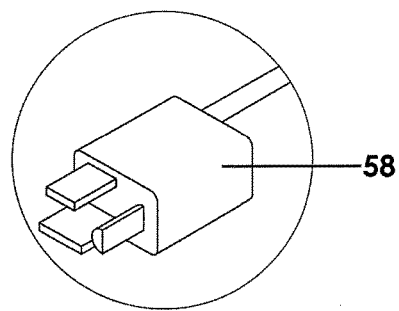
Figure 5:
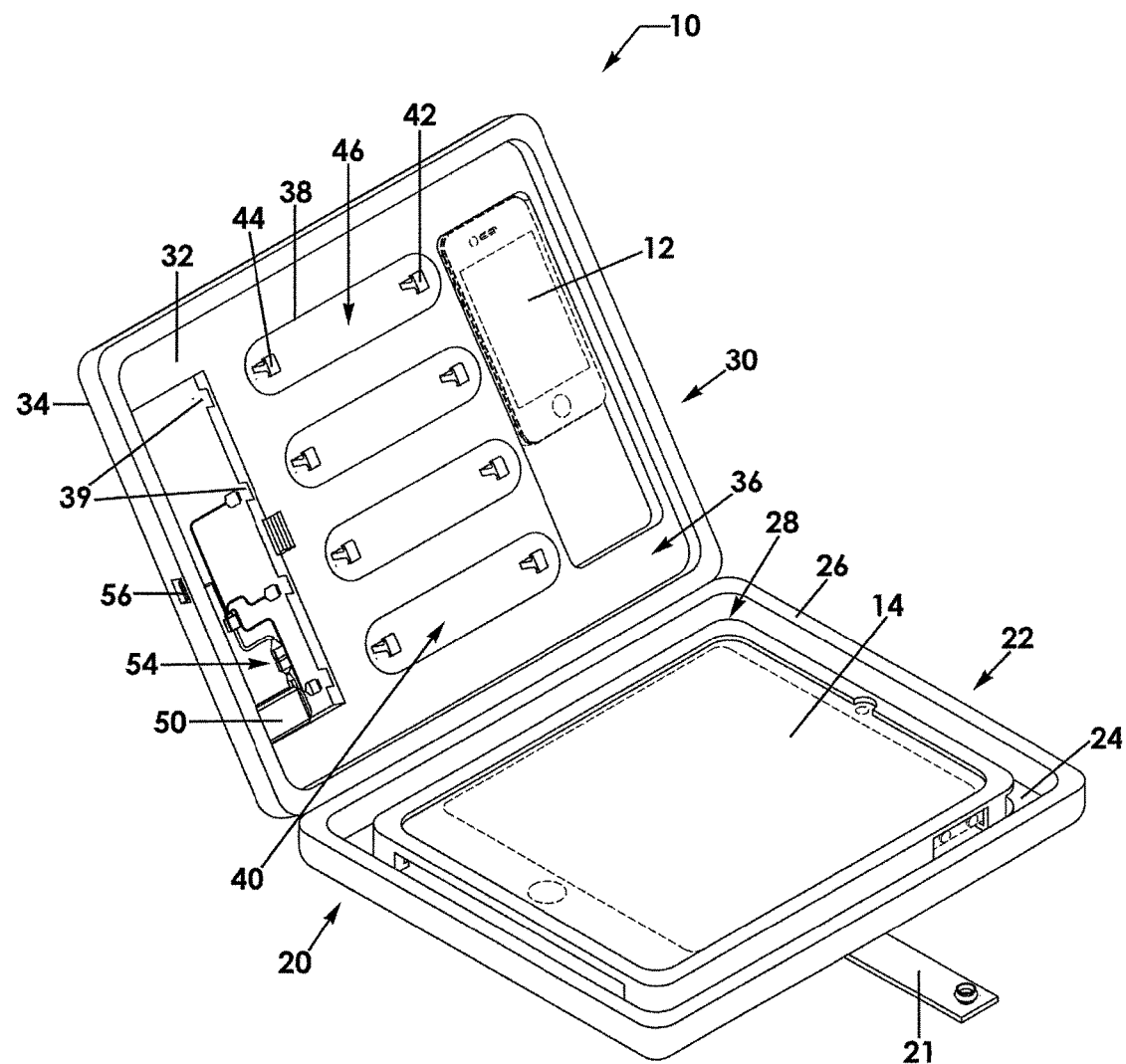
FIG. 5 is another perspective view of the apparatus as in FIG. 2 illustrated with all charging cables removed from the cable racks.
Figure 6:
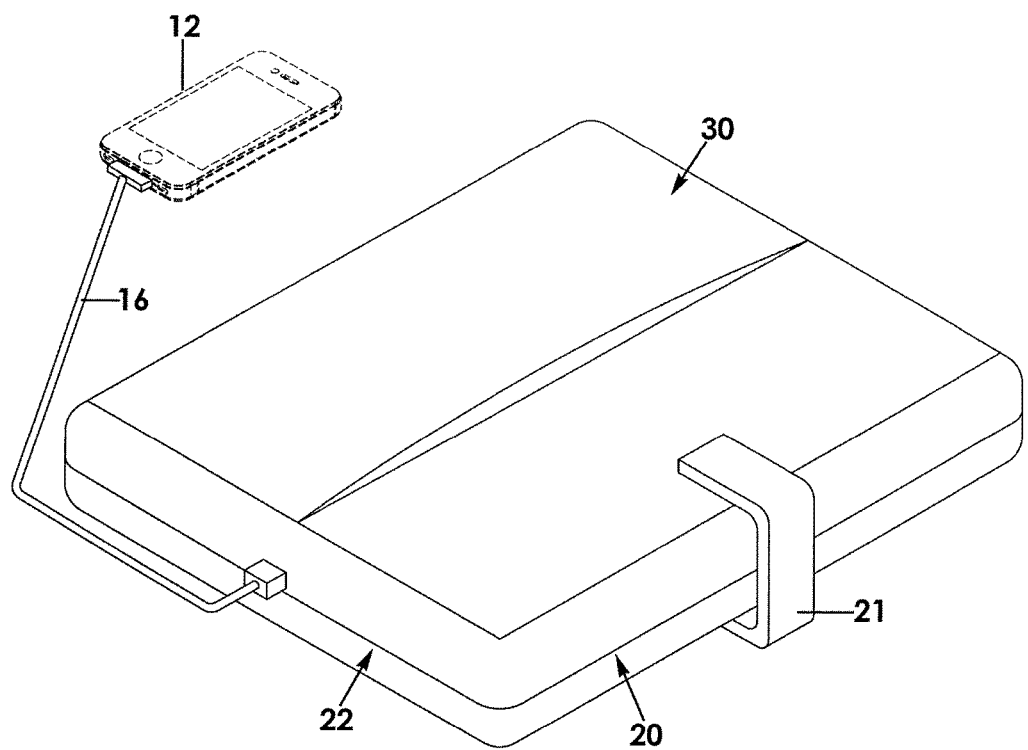
FIG. 6 is a perspective view of the apparatus as in FIG. 1a illustrated with an electronic device electrically connected to the apparatus via an external charging port.

It is understood that multiple charging cables 16 and, as a result, multiple electronic devices may be electrically connected to the master battery 50 simultaneously. Specifically, there is wiring or circuitry positioned in the battery compartment 52 (referred to herein as "interface wiring" 54) that enables multiple, e.g. up to four (4), charging cables to be connected to the master battery 50 and to receive current therefrom (FIGS. 3a and 3b). When the charging cables 16 are connected to the master battery 50 and the opposite ends of said cables are operatively connected to their associated electronic devices 12, 14, the internal batteries of those devices are charged. In other words, the electronic devices positioned in the case 20 are being recharged while being stored or transported in the case 20.

In addition, the interface wiring 54 is also operatively connected to an external charging port 56 (FIGS. 3a-3b). This enables a user to electrically connect a charging cable 16 of an electronic device outside of said case 20 to said master battery 50. In addition, a power cord 58 is electrically connected to the master battery 50 and configured to electrically connect the master battery 50 to an external power source. It is contemplated that the master battery 50 may itself be recharged by connecting the power cord 58 to an alternating current (AC) wall outlet. Additional circuitry may be needed, of course, to convert AC current to DC current.

In use, a user may pack all of his electronic devices into the case 20 so that they can all be recharged while the user is traveling or just while all the devices are stored in a single location. For example, a person's tablet (shown in the figures as a first electronic device 14) may be secured in the lower cavity 28 of the lower portion 22 of the case 20. A charging cable 16 associated with the first electronic device 14 may be secured to a respective cable rack 40. Similarly, the user's mobile phone (shown in the figures as a first electronic device 12) may be secured in a recessed area of the upper cavity 36 of the upper portion 30 of the case 20. A charging cable 16 associated with the first electronic device 12 may be secured to a respective cable rack 40. If the user intends for the electronic devices to be charged while stored or transported in the case 20, appropriate charging cables 16 may be electrically connected to the master battery 50 and to the devices themselves as described above. The devices will then be charged by the master battery 50 during storage or transport.

Accordingly, the present invention is a new level of function and convenience for the business professional who often finds himself traveling with multiple electronic devices and multiple charging cables but who finds it difficult to keep all the devices charged or just to keep all of the equipment organized.

It is understood that while certain forms of this invention have been illustrated and described, it is not limited thereto except insofar as such limitations are included in the following claims and allowable functional equivalents thereof.

The invention claimed is:

1. A portable electronics storage and charging apparatus for use in storing and charging a first and second handheld electronic device that each include a battery and a USB charging cable, comprising:
    a case having a lower portion that includes a bottom wall and upstanding side walls that together define a lower portion cavity, said case having an upper portion that includes a top wall and upstanding side walls that together define an upper portion cavity;
    wherein said upper portion is pivotally coupled to said lower portion and movable between a closed configuration in which said side walls of said lower portion are in contact with said side walls of said upper portion and an open configuration in which said side walls of said lower portion are displaced from said side walls of said upper portion;
    a master battery situated in one of said lower portion cavity and said upper portion cavity;
    wherein said upper portion cavity is configured to selectively receive the first electronic device;
    a plurality of spaced apart cable racks coupled to said top wall of said upper portion of said case, each cable rack being configured to hold a respective charging cable;
    wherein said master battery is selectively coupled to a respective charging cable held by a respective cable rack and configured to transfer current to the first electronic device when the first electronic device is electrically connected to the respective charging cable;
    wherein each said cable rack includes a first post coupled to an inner surface of said top wall of said case and a second post coupled to said inner surface of said top wall and laterally spaced apart from said first post, said first and second posts configured to receive a respective charging cable wrapped thereabout.

2. The portable electronics storage and charging apparatus as in claim 1, wherein:
    said lower portion cavity is configured to selectively receive the second electronic device;
    said master battery is selectively coupled to another respective charging cable held by another respective cable rack and configured to impart current to the second electronic device when the second electronic device is electrically connected to said another respective charging cable.

3. The portable electronics storage and charging apparatus as in claim 1, wherein:
    said lower portion cavity is configured to selectively contain an electronic tablet;
    said upper portion cavity is configured to selectively contain a smart phone.

4. The portable electronics storage and charging apparatus as in claim 1, wherein:
    said upper portion includes a battery compartment defining an interior space, said master battery being situated in said interior space of said battery compartment;
    said plurality of cable racks being in communication with said interior space of said battery compartment such that respective battery cables held by respective cable racks are in communication with said master battery.

5. The portable electronics storage and charging apparatus as in claim 4, wherein:
    said top wall of said upper portion defines a plurality of recessed cavities configured to receive said plurality of cable racks, respectively;
    each recessed cavity being in communication with said battery compartment such that a respective charging cable held by a respective cable rack is selectively connected to said master battery situated in said battery compartment.

6. The portable electronics storage and charging apparatus as in claim 5, wherein said top wall of said upper portion defines a plurality of channels, each channel extending between a respective recessed cavity and said battery compartment and configured to receive a respective charging cable.

7. The portable electronics storage and charging apparatus as in claim 6, comprising interface wiring situated in said battery compartment configured to connect multiple charging cables to said master battery simultaneously.

8. The portable electronics storage and charging apparatus as in claim 5, comprising interface wiring situated in said battery compartment configured to connect multiple charging cables held on respective cable racks to said master battery simultaneously.

9. The portable electronics storage and charging apparatus as in claim 1, comprising an external charging port situated in said upper portion of said case, said charging port configured to electrically connect an electronic device outside of said case to said master battery.

10. The portable electronics storage and charging apparatus as in claim 1, comprising a power cord electrically connected to said master battery and configured to electrically connect said master battery to an external power source.

11. The portable electronics storage and charging apparatus as in claim 7, wherein each said cable rack includes a first post coupled to an inner surface of said top wall of said case and a second post coupled to said inner surface of said top wall and laterally spaced apart from said first post, said first and second posts configured to receive a respective charging cable wrapped thereabout.

\* \* \* \* \*